United States Patent
Kon

(10) Patent No.: US 11,258,424 B1
(45) Date of Patent: Feb. 22, 2022

(54) ACOUSTIC WAVE DEVICE

(71) Applicant: RIVER ELETEC CORPORATION, Yamanashi (JP)

(72) Inventor: Tasuku Kon, Yamanashi-ken (JP)

(73) Assignee: RIVER ELETEC CORPORATION, Yamanashi (JP)

(*) Notice: Subject to any disclaimer, the term of this patent is extended or adjusted under 35 U.S.C. 154(b) by 0 days.

(21) Appl. No.: 16/953,779

(22) Filed: Nov. 20, 2020

(30) Foreign Application Priority Data

Aug. 18, 2020 (JP) .............................. JP2020-138146

(51) Int. Cl.
  *H03H 9/25* (2006.01)
  *H03H 9/02* (2006.01)
  *H03H 9/145* (2006.01)

(52) U.S. Cl.
  CPC ........ *H03H 9/02551* (2013.01); *H03H 9/145* (2013.01)

(58) Field of Classification Search
  CPC ........ H03H 9/25; H03H 9/02; H03H 9/02023; H03H 9/02551; H03H 9/145
  See application file for complete search history.

(56) References Cited

U.S. PATENT DOCUMENTS 6,194,809 B1 *  2/2001  Takeuchi ............. H03H 9/0259
                                            310/313 B
6,483,224 B1 * 11/2002  Kobayashi ............ H03H 3/08
                                            310/313 A
6,833,774 B2 * 12/2004  Abbott ................ H03H 9/6483
                                            310/313 A
6,928,720 B2 *  8/2005  Kobayashi ............ H03H 3/08
                                            29/594

(Continued)

FOREIGN PATENT DOCUMENTS

EP    3 016 282    5/2016
JP    57-68925    4/1982

(Continued)

OTHER PUBLICATIONS

Combined Search and Examination Report under Sections 17 and 18(3) dated May 10, 2021 in corresponding British Patent Application No. GB2018063.4.

*Primary Examiner* — Dean O Takaoka
(74) *Attorney, Agent, or Firm* — Wenderoth, Lind & Ponack, L.L.P.

(57) ABSTRACT

In an acoustic wave device, in a rotated Y-cut crystal substrate to which a rotational angle based on a particular Euler angle is added, a vibration mode located farther in a low phase velocity area than the principal vibration has an electromechanical coupling coefficient $K^2$ lower than that of the principal vibration, and the primary and secondary temperature coefficients of the principal vibration are approximately zero. The acoustic wave device includes a crystal substrate cut from a quartz crystal boule cut by a rotational angle specified by a right-handed Euler angle ($\phi$, $\theta$, $\Psi$), and at least one comb-shape excitation electrode to excite the crystal substrate to make a plate waves. The crystal substrate is made by cutting the quartz crystal boule such that the rotational angle is within ranges of $\phi=0\pm2°$, $\theta=17.5°$ to $19.5°$, and $\Psi=0\pm2°$.

6 Claims, 20 Drawing Sheets

11···Acoustic wave device
12···Crystal substrate
15, 16···Comb-shape excitation electrode

(56) References Cited

U.S. PATENT DOCUMENTS

| | | | | |
|---|---|---|---|---|
| 7,446,453 | B1* | 11/2008 | Naumenko | ........ H03H 9/02559 |
| | | | | 310/313 A |
| 9,800,225 | B2* | 10/2017 | Kon | ................... H03H 9/02551 |
| 2006/0152107 | A1 | 7/2006 | Tanaka | |

FOREIGN PATENT DOCUMENTS

| | | |
|---|---|---|
| JP | 2003-258596 | 9/2003 |
| JP | 4306668 | 8/2009 |
| JP | 4465464 | 5/2010 |
| JP | 5563378 | 7/2014 |

\* cited by examiner

11···Acoustic wave device
12···Crystal substrate
15, 16···Comb-shape excitation electrode

Fig. 11

| Vibration mode | Theoretical value | | Experimental value |
| --- | --- | --- | --- |
| | Phase velocity v [m/sec] | Electromechanical coupling coefficient $K^2$ [%] | Phase velocity v [m/sec] |
| S1 | 3259 | 0.004 | 3275 |
| S2 | 3488 | 0.002 | 3546 |
| S3 (Principal vibration) | 3774 | 0.116 | 3786 |
| S4 | 3914 | 0.004 | 3935 |
| S5 | 4100 | 0.005 | 4189 |
| S6 | 4700 | 0.060 | 4719 |
| S7 | 5356 | 0.012 | 5300 |
| S8 | 5492 | 0.025 | 5537 |
| S9 | 5685 | 0.077 | 5700 |
| S10 | 6342 | 0.029 | 6360 |
| S11 | 6580 | 0.002 | 6541 |
| S12 | 6732 | 0.014 | 6704 |

ACOUSTIC WAVE DEVICE

CROSS-REFERENCE TO RELATED APPLICATIONS

The present application is based on and claims benefit of Japanese Patent Application No. 2020-138146 filed on Aug. 18, 2020, the disclosure of which is incorporated herein by reference in its entirety.

TECHNICAL FILED

The present application relates to acoustic wave devices used in high-frequency oscillation sources in instruments such as computers and communications instruments.

DISCUSSION OF THE BACKGROUND

The statements in this section merely provide background information related to the present disclosure and do not necessarily constitute prior art.

Japanese laid-open application publication No. JP57-68925A discloses a piezoelectric device that uses an elastic wave mode occurring in a rotated Y-cut crystal substrate. The piezoelectric device has such a structure that a comb-shaped excitation electrode is formed on the front surface of a crystal substrate and that a thin film used for frequency adjustment purposes is formed on the back surface of the crystal substrate. The crystal substrate is made by cutting a quartz crystal boule by defining a predetermined rotational angle specified by Euler angle.

Japanese laid-open application publication No. JP 2003-258596A and Japanese Patent No. JP 4465464B disclose resonators for making elastic waves oscillate. In those disclosed resonators, the crystal substrate is made by cutting a quartz crystal boule by defining a predetermined rotational angle specified by Euler angle. And the cutting angles of the crystal substrate are specified by two-axis rotational angles. The resonators disclosed in these patent documents have such a structure that a comb-shape excitation electrode is provided on a surface of the piezoelectric substrate, and that in this structure, no thin film and associated elements for adjusting frequency are provided on the back surface of the crystal substrate. The resonator disclosed in Japanese Patent No. JP 4465464B has such a frequency temperature characteristic that draws a cubic curve having an inflection point in the vicinity of 25° C.

Japanese Patent No. JP 4306668B discloses a high-frequency resonator configured by using a rotated Y-cut crystal substrate specified by Euler angle. This resonator has such a structure that a comb-shape excitation electrode is provided on a surface of the piezoelectric substrate, and that in this structure, no thin film and associated elements for adjusting frequency are provided on the back surface of the crystal substrate.

Japanese Patent No. JP 5563378B discloses an acoustic wave device that includes a crystal substrate cut by a predetermined Euler angle. In the acoustic wave device, the thickness of the crystal substrate and the thickness of an electrode film formed on the crystal substrate are specified.

SUMMARY

An acoustic wave device disclosed in the present application includes: a crystal substrate cut from a quartz crystal boule having three-dimensional crystal orientations defined by an X axis, a Y axis, and a Z axis, the quartz crystal boule being cut on the Y axis and the Z axis while being rotated about the X axis, the quartz crystal boule being cut by a rotational angle specified by a right-handed Euler angle ($\phi$, $\theta$, $\Psi$); and at least one comb-shape excitation electrode configured to excite the crystal substrate to make plate waves. The crystal substrate is made by cutting the quartz crystal boule such that the rotational angle is within ranges of $\phi=0\pm2°$, $\theta=17.5°$ to $19.5°$, and $\Psi=0\pm2°$. A plate wave, among the plate waves, having a phase velocity in a range of from 3500 to 4000 m/s, is selected as a vibration mode of the crystal substrate. When H represents a substrate-thickness of the crystal substrate and $\lambda$ represents a wavelength of the plate waves, a normalized plate thickness $H/\lambda$ is in a range of $1.5<H/\lambda<2.0$.

As used herein, the normalized plate thickness $H/\lambda$ is obtained by dividing the thickness H (unit: m) of the crystal substrate by the wavelength $\lambda$ (unit: m), and is a definition used to specify the H dimension irrespective of designed frequency ($=\lambda$). In the following description, the normalized plate thickness will be denoted as normalized plate thickness $H/\lambda$. The same applies in normalized excitation-electrode film thickness $Hs/\lambda$ and normalized back-surface electrode film thickness $Hb/\lambda$, which will be described later.

Technical Problem

Currently, mainly AT-cut crystal resonators are widely used as oscillation sources equipped in various kinds of electronic devices, especially for reference signals for wireless applications. In high-frequency applications, signals are used by being multiplied using a PLL into a predetermined frequency. Also, in some applications where there is a need for a signal with minimized noise at high frequency, a surface acoustic wave device, which uses a surface acoustic wave, is used as a direct oscillation source.

Crystal resonators treated with AT-cutting provide their frequency characteristics over a stable and wide range of temperature, and as such, are used as oscillation sources in various kinds of electronic devices. In applications where such crystal resonators are used as high-frequency oscillation sources, high-precision processing techniques are required, such as decreasing the degree of thinness and increasing the degree of flatness.

In contrast, surface acoustic waves use a longitudinal wave or a lateral wave occurring on the outer layer surface of a piezoelectric (crystal) substrate, and have such a characteristic that their frequencies are proportional to phase velocity and inversely proportional to wavelength. A surface acoustic wave device, which uses such surface acoustic waves, includes an excitation electrode made up of a plurality of electrode fingers arranged in a comb shape on a surface of a crystal substrate that is formed by being cut at a predetermined cutting angle. By adjusting the thickness of the excitation electrode and/or the pitch between each electrode finger, a predetermined oscillation frequency is obtained.

While the above-described AT-cut crystal resonator is highly accurate in oscillation frequency, the inventor has recognized, jitter is caused to occur by factors such as phase noise and signal time variation or fluctuation at the time when a signal is multiplied to a predetermined frequency. In contrast, surface acoustic wave devices have no phase noise and jitter problems because surface acoustic wave devices are capable of directly oscillating high-frequency signals. However, the inventor has recognized that there is room for improvement in accuracy in oscillation frequency as compared with AT cut crystal resonators. The inventor has further recognized that in resonators such that cutting angles of crystal substrates are specified by two-axis rotational angles, there is room for improvement in ease of production and/or variation in frequency temperature characteristic.

In contrast, in acoustic wave devices using plate waves, it is known that an vibration wave (plate wave) occurring in an acoustic wave device is in such a vibration mode that a lateral wave and a longitudinal wave are connected, and that there are a plurality of vibration modes each corresponding to a different degree of combination of the lateral wave and the longitudinal wave. In these-vibration modes using plate waves, as opposed to conventional Rayleigh waves, there may be other-vibration modes than a vibration mode intended to be used for an acoustic wave device (this vibration mode will be hereinafter referred to as principal vibration). Specifically, there may be vibration modes different in phase velocity (these vibration modes will be hereinafter referred to unnecessary vibrations). When an electrical signal of unnecessary vibration is converted into a mechanical vibration at a conversion efficiency (this conversion efficiency will be hereinafter referred to as electromechanical coupling coefficient $K^2$), and when the principal vibration and the reflection coefficient have the same sign, then there may be such a case, at the time when an acoustic wave device is established, that the unnecessary vibration has a figure of merit of two or more and an equivalent series resistance R1 lower than the equivalent series resistance R1 of the principal vibration. It is to be noted that the term "figure of merit" is a quotient obtained by dividing Q value of an acoustic wave device by capacity ratio $\gamma$, and indicates a vibration strength of a mechanical acoustic wave device as seen from an electric terminal. This has caused an abnormal oscillation at the time of making an oscillation at an oscillation circuit. Also, in Colpitts oscillation circuits, which are commonly used, an abnormal oscillation may possibly occur when the above-described unnecessary vibration is located farther in a low frequency area than the principal vibration.

In an acoustic wave device that includes a crystal substrate cut by a predetermined Euler angle and the thickness of the crystal substrate and the thickness of an electrode film formed on the crystal substrate are specified, primary and secondary temperature coefficients can be made close to a value of zero by adjusting the Euler angle specified and/or the thickness of the crystal substrate. However, the inventor has recognized that this range of Euler angle has a limitation in making tertiary temperature coefficient close to a value of zero. In such acoustic wave device, an unnecessary vibration of a large electromechanical coupling coefficient $K^2$ exists farther in the low frequency area than the principal vibration. Under the circumstances, in the Colpitts oscillation circuit, an oscillation is made in a vibration mode located farther in the low frequency area than the principal vibration.

In light of the considerations above, it is an object of the present application to provide an acoustic wave device that ensures that a tertiary temperature coefficient closer to a value of zero is obtained. In the acoustic wave device, in a rotated Y-cut crystal substrate to which a rotational angle based on a particular Euler angle is added, a vibration mode located farther in a low phase velocity area than the principal vibration has an electromechanical coupling coefficient $K^2$ lower than that of the principal vibration; and the primary and secondary temperature coefficients of the principal vibration are made values of approximately zero.

It is also an object of the present application to provide an acoustic wave device that: is capable of directly oscillating a high frequency; is superior to AT-cut resonators in oscillation frequency accuracy over a wide range of temperature; and eliminates or minimizes an abnormal oscillation caused by an unnecessary vibration.

Advantageous Effects of Invention

The acoustic wave device disclosed in the present application includes a crystal substrate cut by a conventionally unspecified rotational angle $\theta$, namely, a right-handed Euler angle ($\phi=0\pm2°$, $\theta=17.5°$ to $19.5°$, $\Psi=0\pm2°$). With this crystal substrate by the above-described Euler angle, such a plate wave is selected that the phase velocity is set in the range of from 3500 to 4000 m/s and that the normalized plate thickness H/λ is in the range of 1.5<H/λ<2.0. By selecting such plate wave, primary temperature coefficient $\alpha$, secondary temperature coefficient $\beta$, and tertiary temperature coefficient $\gamma$ were Taylor-expanded at 25° C. were made close to values of zero. The following is a Taylor expansion formula indicating a relationship between frequency variation $\Delta f/f$ and $\alpha$, $\beta$, and $\gamma$.

$$\Delta f/f = \alpha(t-t_0) + \beta(t-t_0)^2 + \gamma(t-t_0)^3$$

$t_0$: Reference temperature

This configuration ensures that the oscillation frequency accuracy increases over a wide range as compared with conventional acoustic wave devices and AT-cut resonators, and that high-frequency oscillations are obtained at basic wave. Further with the above configuration, an acoustic wave device having an excellent frequency characteristic, with minimized phase noise and jitter, was obtained. Also, the above configuration ensures that electromechanical coupling coefficients $K^2$ of all unnecessary vibrations having phase velocity V lower than that of a principal vibration are significantly smaller than the electromechanical coupling coefficient $K^2$ of the principal vibration. This ensures that the oscillation frequency accuracy increases over a wide range as compared with conventional elastic wave resonators and AT-cut resonators, and that abnormal oscillations caused by unnecessary vibrations are eliminated or minimized.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein

FIG. 11 is a table listing theoretical values and experimental values of the phase velocity V corresponding to respective vibration modes.

DETAILED DESCRIPTION OF EMBODIMENTS

Figure 1:
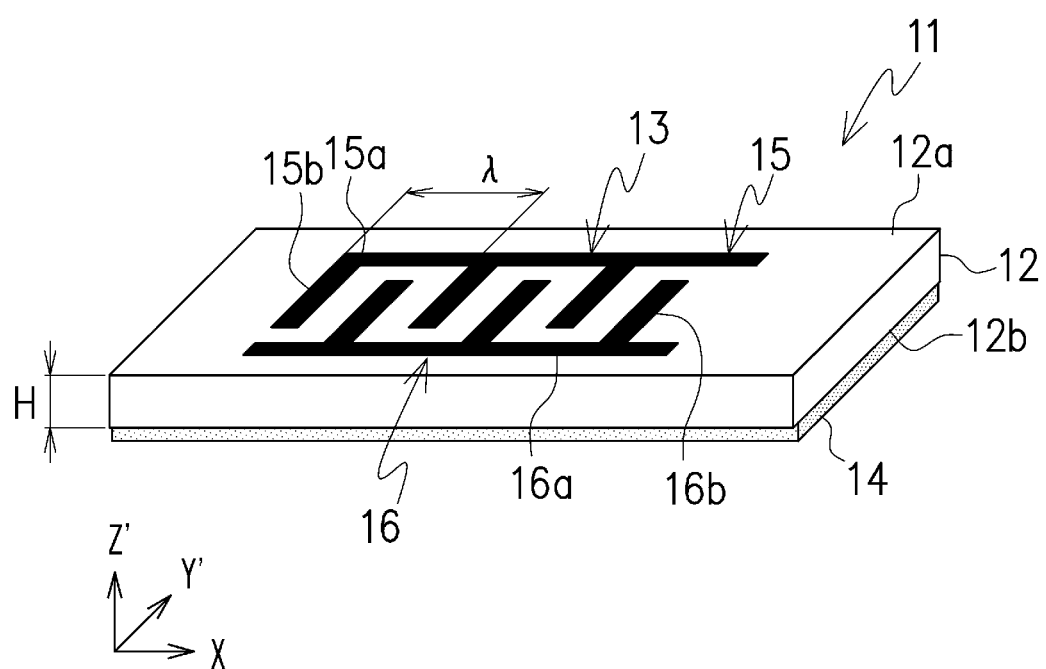
FIG. 1 is a perspective view of an exterior of an acoustic wave device according to an embodiment of the present application.

Embodiments of the subject matter now will be described in further detail hereinafter with reference to the attached figures. In the figures, identical or corresponding constituents are identified using the same reference numerals, and redundant description is omitted. Also, the figures are not necessarily to scale, as the size of some of the structures or portions of the figures may be exaggerated relative to other structures or portions for illustrative purposes. Further, some of the figures are schematically illustrated to facilitate understanding of the structures represented therein.

While the specification and drawings detail certain example embodiments of the subject matter, the subject matter may, however, be embodied in many different forms and should not be construed as limited to the embodiments set forth herein. Rather, these example embodiments are provided so that this disclosure will be thorough and complete, and will fully convey the scope of the subject matter to those skilled in the art.

As illustrated in FIG. 1, an acoustic wave device 11 according to this embodiment includes: a crystal substrate 12, which has a thin planar shape; an excitation electrode 13, which is formed on a front surface 12a of the crystal substrate 12; and a back-surface electrode 14, which is formed on a back surface 12b of the crystal substrate 12.

The crystal substrate 12 is cut from a quartz crystal boule having three-dimensional crystal orientations defined by an X axis, a Y axis, and a Z axis; specifically, the quartz crystal boule is cut on the Y axis and the Z axis while being rotated about the X axis. The Y axis resulting from the rotation will be referred to as Y' axis, and the Z axis resulting from the rotation will be referred to as Z' axis.

The crystal substrate 12 is cut by a right-handed Euler angle ($\phi=0\pm2°$, $\theta=17.5°$ to $19.5°$, $\Psi=0\pm2°$), and thus is formed into a predetermined thickness. Also, $\phi$ and $\Psi$ differential values of α, β, and γ where $\phi$ or $\Psi=0$ with respect to a predetermined rotational angle θ from a state of crystal symmetry of the crystal substrate are values of zero. Therefore, insofar as $\phi=0\pm2°$ and $\Psi=0\pm2°$, any change in frequency temperature characteristic is significantly small. A tolerance range of the Euler angle is $\pm2.0°$ because in this range there is no or minimal influence on frequency temperature characteristic, as recited in Japanese laid-open application publication No. JP2003-258596A.

The excitation electrode 13 is made up of a pair of comb-shape excitation electrodes 15, 16. The comb-shape excitation electrodes 15, 16 include: base electrodes 15a, 16a, which are parallel to each other and extend along a longitudinal direction of the crystal substrate 12; and a plurality of electrode fingers 15b, 16b, which extend from side surfaces of the respective base electrodes 15a, 16a toward the facing longitudinal directions. Thus, the excitation electrode 13 is arranged such that the electrode fingers 15b, which extend from the one base electrode 15a, and the electrode fingers 16b, which extend from the other base electrode 16a, are in a mutually non-contact state. The distance (pitch) between the electrode finger 15b and the electrode finger 16b is set based on the wavelength λ of the plate wave to be excited. Also, the pitch is approximately λ/2, relative to the wavelength λ. By applying voltage to the excitation electrode 13 such that the comb-shape excitation electrodes 15, 16 are different in polarity, an alternating electric field occurs between adjacent electrode fingers, thereby exciting a plate wave in the crystal substrate 12.

By rotated Y-cutting of the crystal substrate 12, its plate thickness H is made into a thickness approximately identical to the wavelength λ of the plate wave to be excited. The plate thickness H is adjusted such that the principal vibration satisfies a predetermined frequency temperature characteristic based on a relationship between the thickness of the excitation electrode 13 and the thickness of the back-surface electrode 14. At the same time, an electromechanical coupling coefficient $K^2$ of an unnecessary vibration located farther in the low phase velocity area than the principal vibration is set to be smaller than the electromechanical coupling coefficient of the principal vibration.

As illustrated in FIG. 1, the excitation electrode 13 is provided approximately at the center of the front surface 12a of the crystal substrate 12, and is a metal film mainly formed of gold (Au) or aluminum (Al). The metal film is formed into a predetermined thickness. Reflectors (not illustrated) may be provided on both sides of the excitation electrode 13 in its longitudinal direction, so that the excitation electrode 13 is provided between the reflectors. By providing the reflectors, the plate wave excited at the excitation electrode 13 is confined in the space between the reflectors provided on both sides, thereby providing a larger amount of resonance.

The back-surface electrode 14 is formed on the back surface 12b of the crystal substrate 12, which is opposite to the excitation electrode 13. The back-surface electrode 14 is formed on the back surface 12b of the crystal substrate 12 by making a film that is made of a metal material such as Au or a dielectric material and that has a predetermined thickness. The metal material may be other than Au such as Al, Ta, and Cu, and the dielectric material may be $SiO_2$, ZnO, or $Ta_2O_5$. By changing the thickness of the back-surface electrode 14, which is made of the above-described material, the oscillation frequency is finely adjusted, and by using the relationship between the plate thickness H and the thickness of the excitation electrode 13, the tertiary temperature characteristic is maintained in the principal vibration.

Figure 2:
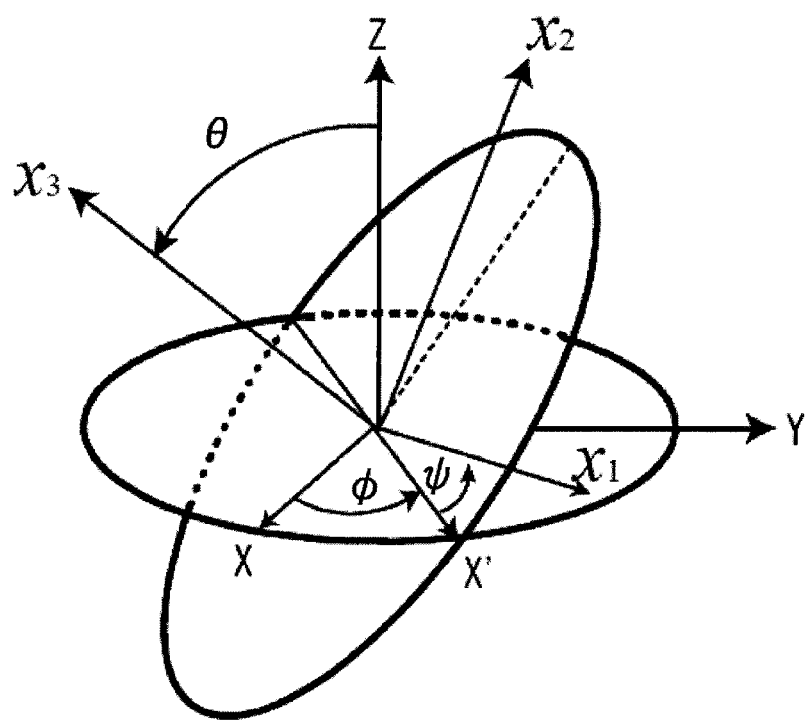
FIG. 2 shows a right-handed Euler angle coordinate system illustrating cutting angles of the acoustic wave device illustrated in FIG. 1.
Figure 3:
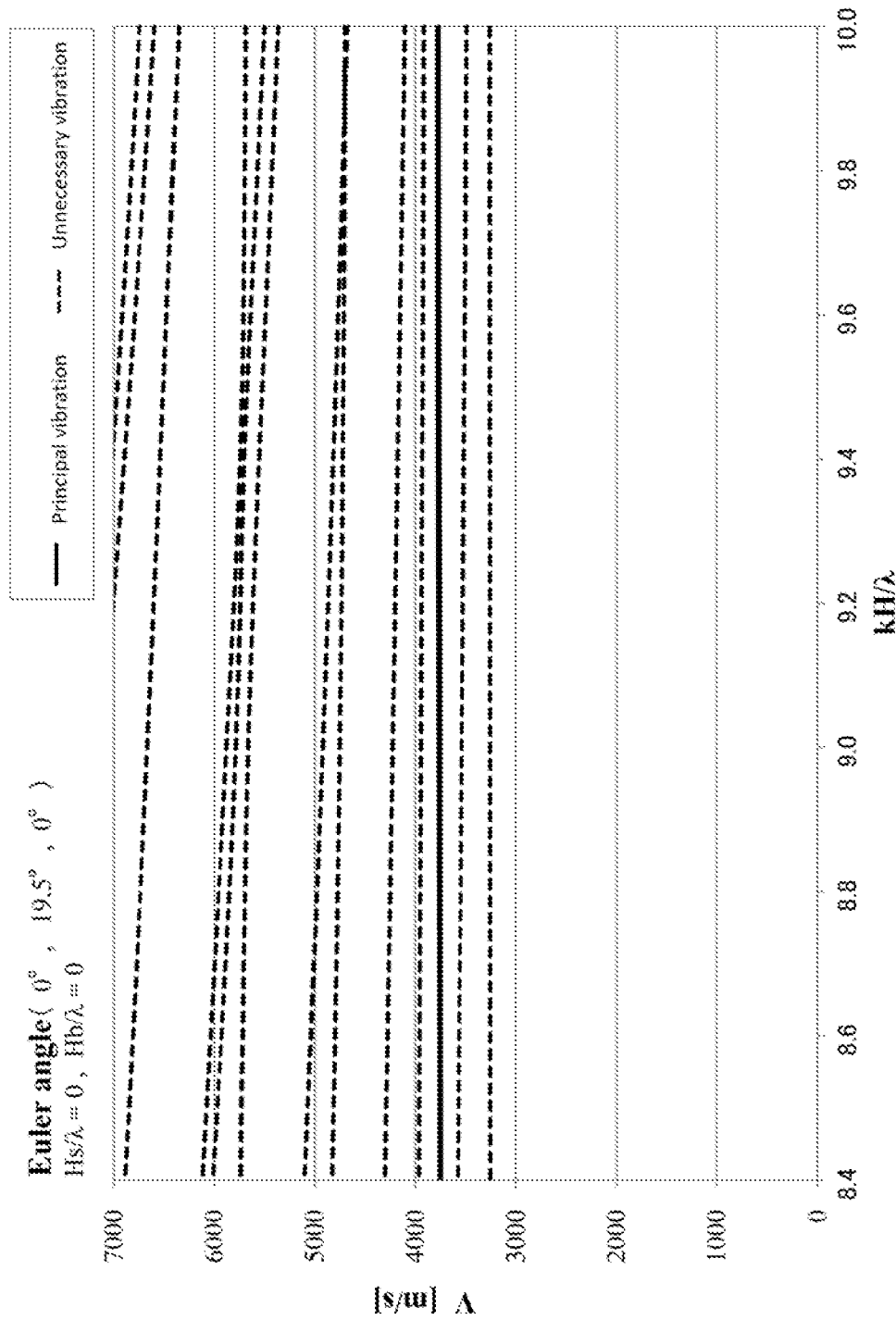
FIG. 3 is a graph showing a dispersion of phase velocity V in vibration modes of a plurality of plate waves occurring in the acoustic wave device illustrated in FIG. 1.

FIG. 2 shows a right-handed Euler angle coordinate system ($\varphi$, $\theta$, $\Psi$). In the figure, $\varphi$ denotes a rotational angle about the Z axis; $\theta$ denotes a rotational angle about X' axis (an angle obtained by rotating the X axis about the Z axis by $\varphi$); and $\Psi$ denotes a rotational angle about Z" axis (an angle obtained by rotating Z axis about the X' axis by $\theta$). Also, the crystal substrate described by Euler angle ($\varphi=0°$, $\theta=0°$, $\Psi=0°$) is a rotated Z-cut substrate whose main surface is perpendicular to the Z axis (optical axis) of the quartz crystal boule. In the following description, various kinds of analysis associated with the acoustic wave device 11 will be described by referring to this coordinate system. FIG. 3 shows dispersion curves of plate waves propagating in the crystal substrate 12, which is made by cutting by the Euler angle ($\varphi=0°$, $\theta=19.5°$, $\Psi=0°$). The dispersion curves are as of normalized excitation-electrode film thickness (Hs/$\lambda$)=0 and normalized back-surface electrode film thickness (Hb/$\lambda$)=0. The normalized excitation-electrode film thickness is defined by the wavelength $\lambda$ and the thickness Hs of the comb-shape excitation electrode. The normalized back-surface electrode film thickness is defined by the wavelength $\lambda$ and the thickness Hb of the back-surface electrode.

FIG. 3 shows dispersion curves of plate waves as combinations of longitudinal waves, fast lateral wave, slow lateral waves, and electromagnetic waves. The horizontal axis of the graph is the product of wave number k and the plate thickness H. A plate wave is a complex combination of the above-described waves, and there are countless vibration modes ranging from a fast vibration mode in which the phase velocity V is equal to or more than 10000 m/s to a slow vibration mode in which the phase velocity V is approximately 3000 m/s. In the acoustic wave device disclosed in the present application, such a vibration mode is selected and used, from among the plurality of vibration modes, that the electromechanical coupling coefficient $K^2$ is high and a predetermined frequency temperature characteristic is satisfied. In FIG. 3, a vibration mode used in the present application is indicated by a solid line, unnecessary vibration modes are indicated by broken lines. In the present application, such a vibration mode is selected that the phase velocity V is 3500 to 4500 m/s at 5.0 to 7.5 kh indicated by the solid line. The selected vibration mode is a vibration mode in which the electromechanical coupling coefficient $K^2$ is highest among plate wave vibrations counted from the one with the lowest phase velocity V. Further, the selected vibration mode is the first vibration mode in which the figure of merit is two or more among plate wave vibrations counted from the one with the lowest phase velocity V. In all the other vibration modes in which the phase velocity V is lower than in the above-described vibration mode, the electromechanical coupling coefficient $K^2$ is as significantly small as equal to or less than 0.02%. Therefore, in a vibration mode occurring in an area of lower phase velocity V than that of the principal vibration, the figure of merit does not become two or more.

Figure 4:
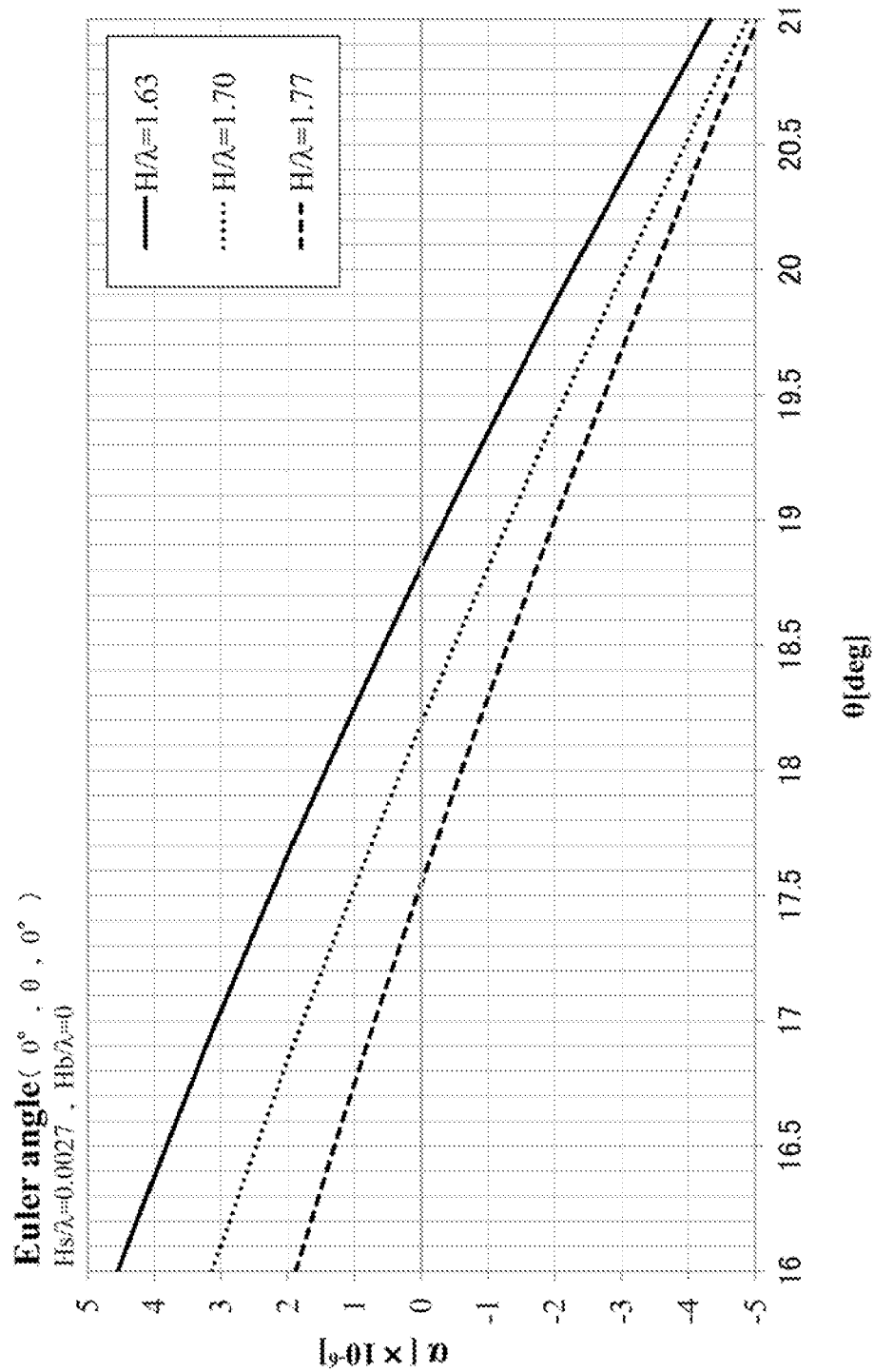
FIG. 4 is a graph of, obtained by calculation, normalized plate thicknesses H/λ in relation to rotational angle $\theta$ and primary temperature coefficient $\alpha$.
Figure 5:
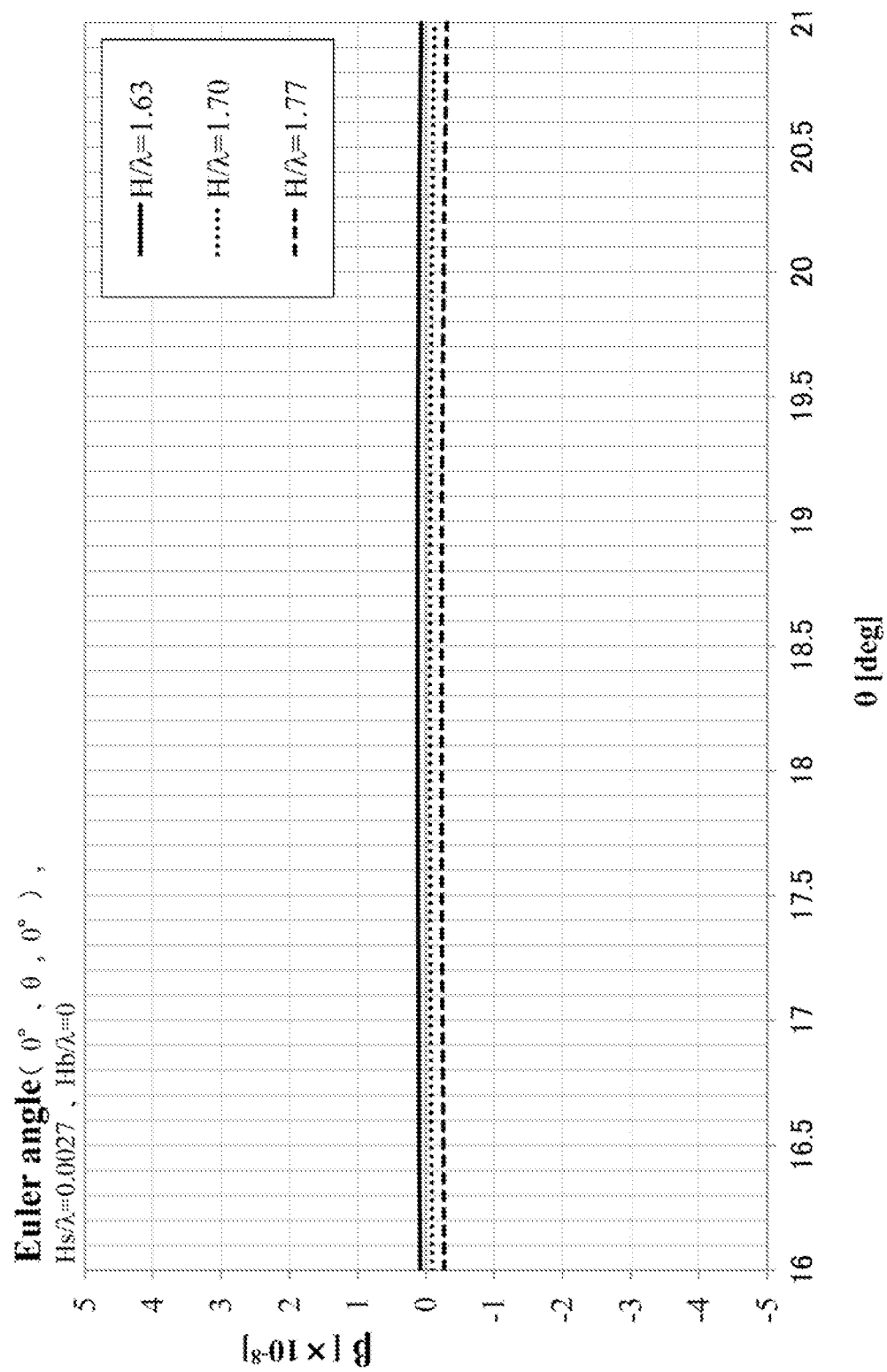
FIG. 5 is a graph of, obtained by calculation, normalized plate thicknesses H/λ in relation to rotational angle $\theta$ and secondary temperature coefficient $\beta$.
Figure 6:
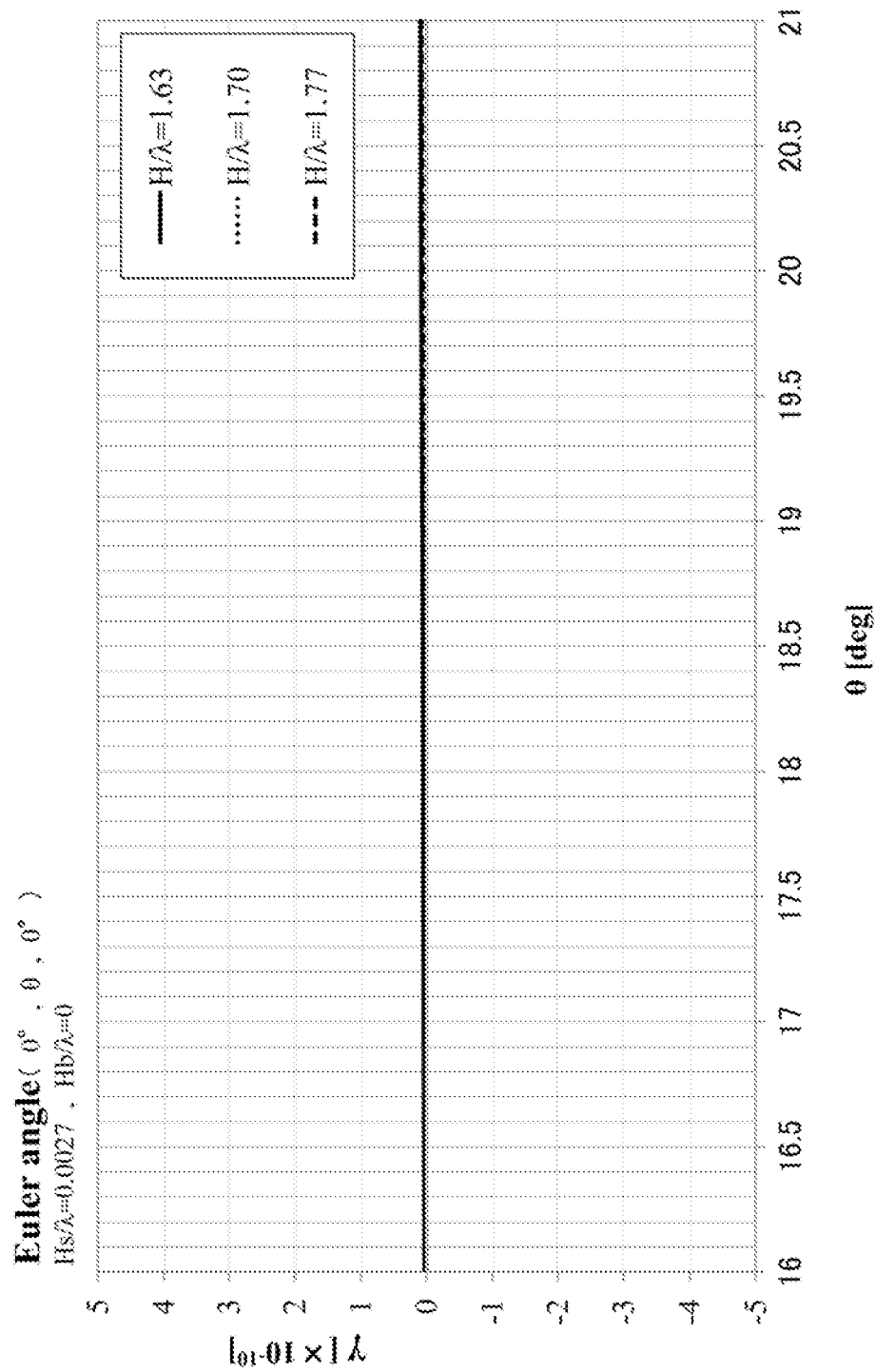
FIG. 6 is a graph of, obtained by calculation, normalized plate thicknesses H/λ in relation to rotational angle $\theta$ and tertiary temperature coefficient $\gamma$.

FIGS. 4 to 6 are graphs of plate waves propagating in crystal substrates specified by the Euler angle (0°, $\theta$, 0°) and the normalized plate thickness (H/$\lambda$), showing a relationship between: the frequency temperature characteristics in the vibration mode used in the present application (namely, the primary temperature coefficient $\alpha$, the secondary temperature coefficient $\beta$, and the tertiary temperature coefficient $\gamma$); the rotational angle $\theta$; and H/$\lambda$. The curves shown in the graphs indicate values calculated with $\theta$ in the range of from 16° to 21° under three conditions: H/$\lambda$ is 1.63, 1.70, and 1.77. Also, Hs/$\lambda$=0.0027, and Au is used as the electrode material. As illustrated in FIG. 4, when H/$\lambda$=1.7, $\alpha$ becomes a value of approximately zero in the vicinity of $\theta$=18.3. As illustrated in FIGS. 5 and 6, $\beta$ and $\gamma$ become values of approximately zero throughout the $\theta$ range. Thus, it is seen that the rotational angle $\theta$ has an influence only on $\alpha$, and has no or minimal influence on $\beta$ and $\gamma$.

Figure 7:
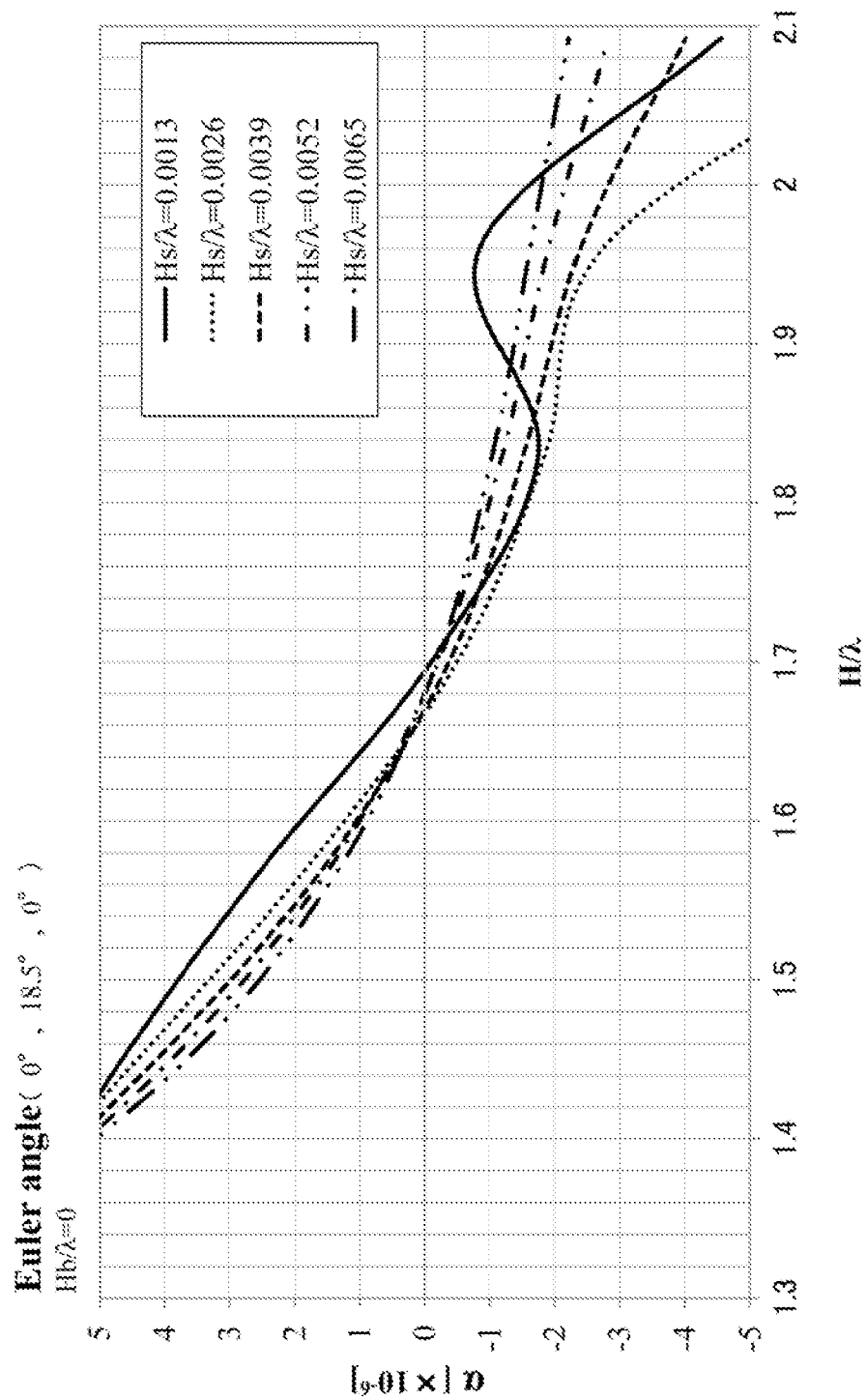
FIG. 7 is a graph of, obtained by calculation, normalized excitation-electrode film thicknesses Hs/λ in relation to normalized plate thickness H/λ and primary temperature coefficient α.
Figure 8:
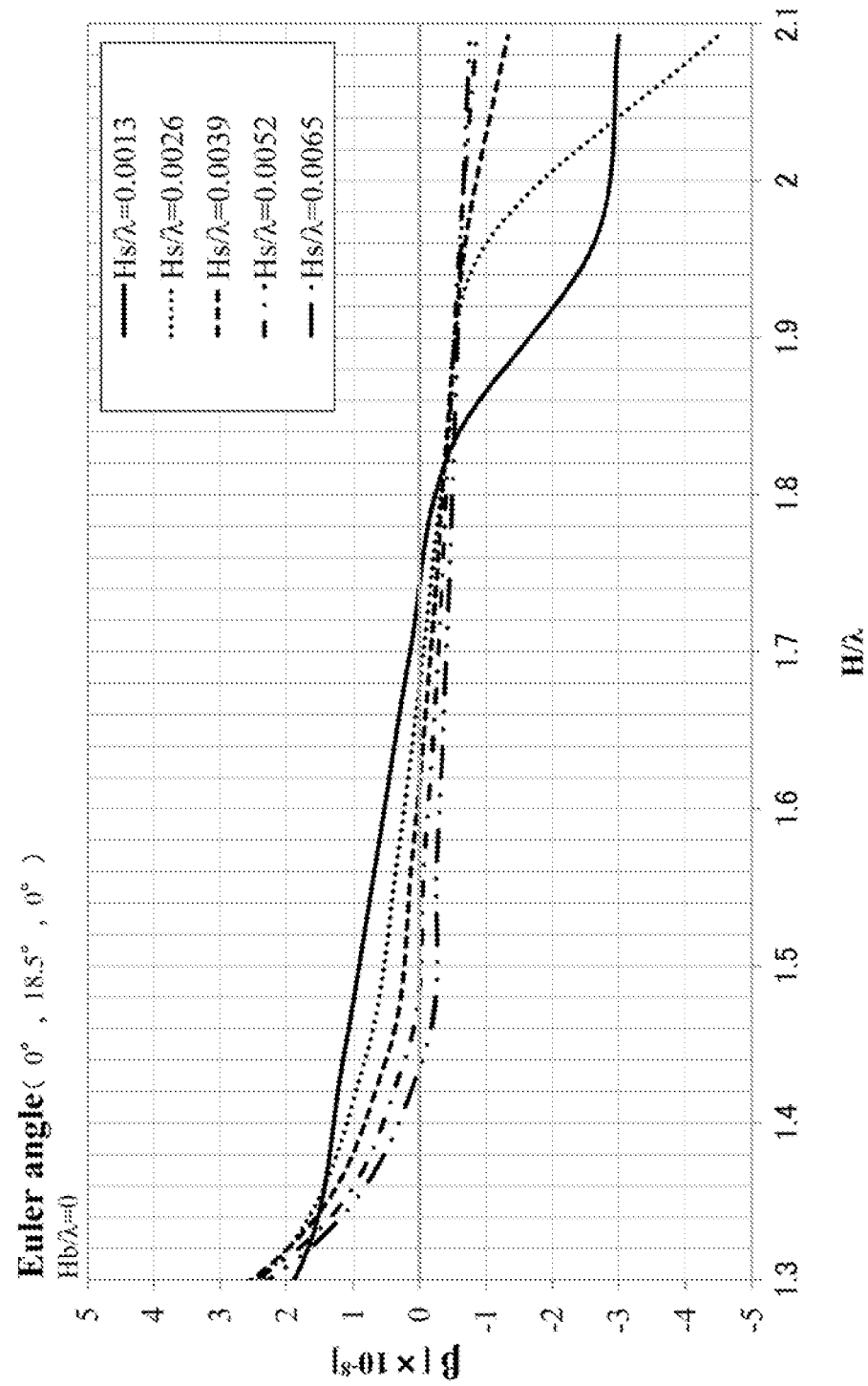
FIG. 8 is a graph of, obtained by calculation, normalized excitation-electrode film thicknesses Hs/λ in relation to normalized plate thickness H/λ and secondary temperature coefficient β.
Figure 9:
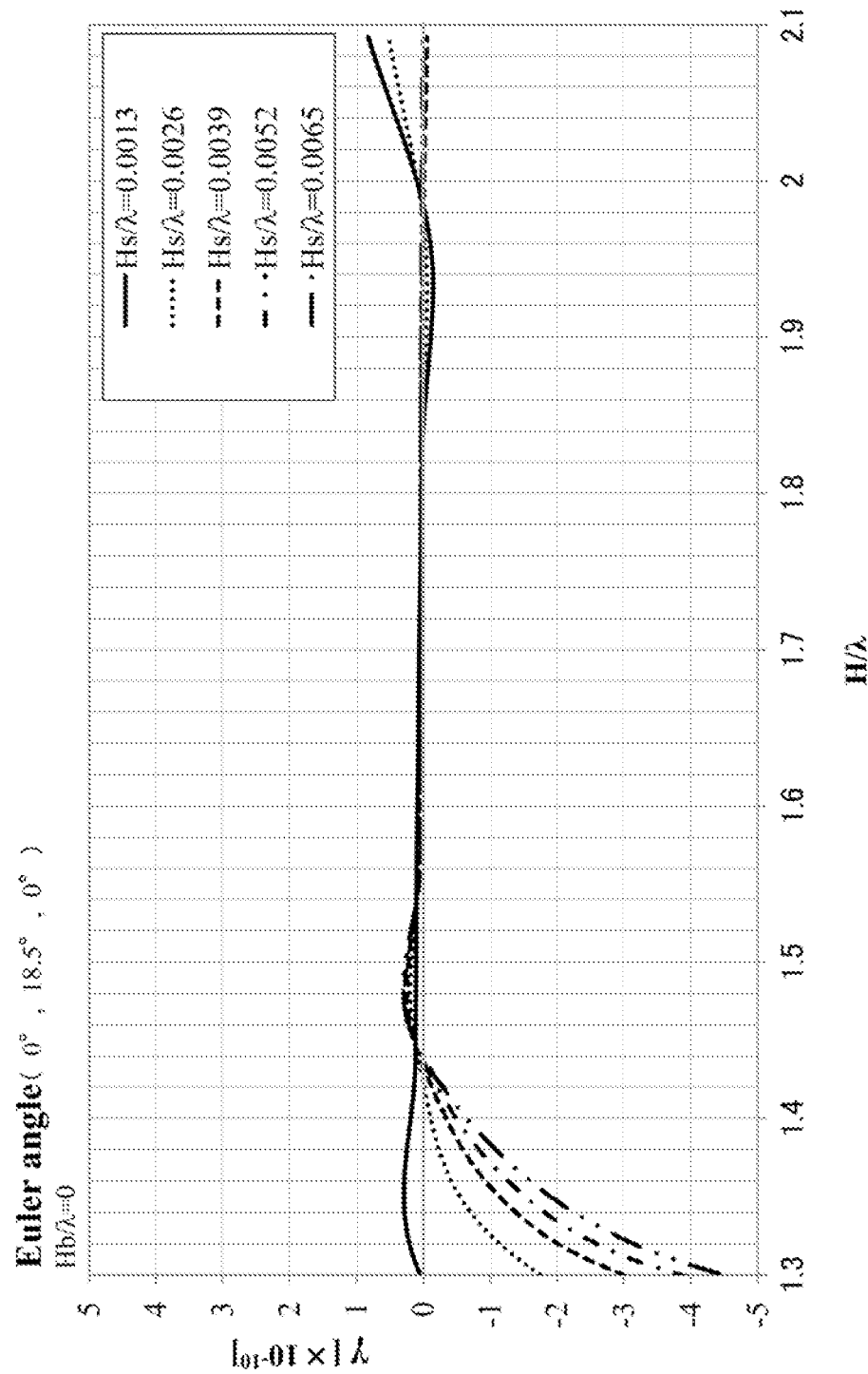
FIG. 9 is a graph of, obtained by calculation, normalized excitation-electrode film thicknesses Hs/λ in relation to normalized plate thickness H/λ and tertiary temperature coefficient γ.

FIGS. 7 to 9 are graphs of a relationship between the frequency temperature characteristic (the primary temperature coefficient $\alpha$, the secondary temperature coefficient $\beta$, and the tertiary temperature coefficient $\gamma$) of an acoustic wave device using a crystal substrate having a Euler angle (0°, 18.5°, 0°) is used. The relationship is obtained by calculation with H/$\lambda$ changed for each Hs/$\lambda$. Hs/$\lambda$ was set using Au under five conditions: 0.0013, 0.0026, 0.0039, 0.0052, and 0.0065. As illustrated in FIG. 7, $\alpha$ relative to Hs/$\lambda$ under the five conditions becomes a value of approximately zero in the vicinity of H/$\lambda$=1.65 to 1.75. As illustrated in FIG. 8, $\beta$ is distributed in the vicinity of the value of zero with H/$\lambda$ in the range of from 1.5 to 1.8. As illustrated in FIG. 9, $\gamma$ becomes a value of approximately zero with H/$\lambda$ in the range of from 1.5 to 2.0. Also in FIGS. 8 and 9, sharp rise and fall phenomena are observed in the vicinity of the lower limit and the upper limit of H/$\lambda$. This is attributed to a combination with a vibration mode adjacent to the principal vibration, causing H/$\lambda$ to be changed by Hs/$\lambda$. In a range in which such change occurs, the variation of the frequency temperature characteristic of the acoustic wave device at production time increases, which is not preferable from a production point of view. Under the circumstances, the above-described calculation result shows that by setting H/$\lambda$ in the range of from 1.5 to 2.0 relative to Hs/$\lambda$ under the five conditions, a predetermined frequency temperature characteristic is satisfied.

Figure 10:
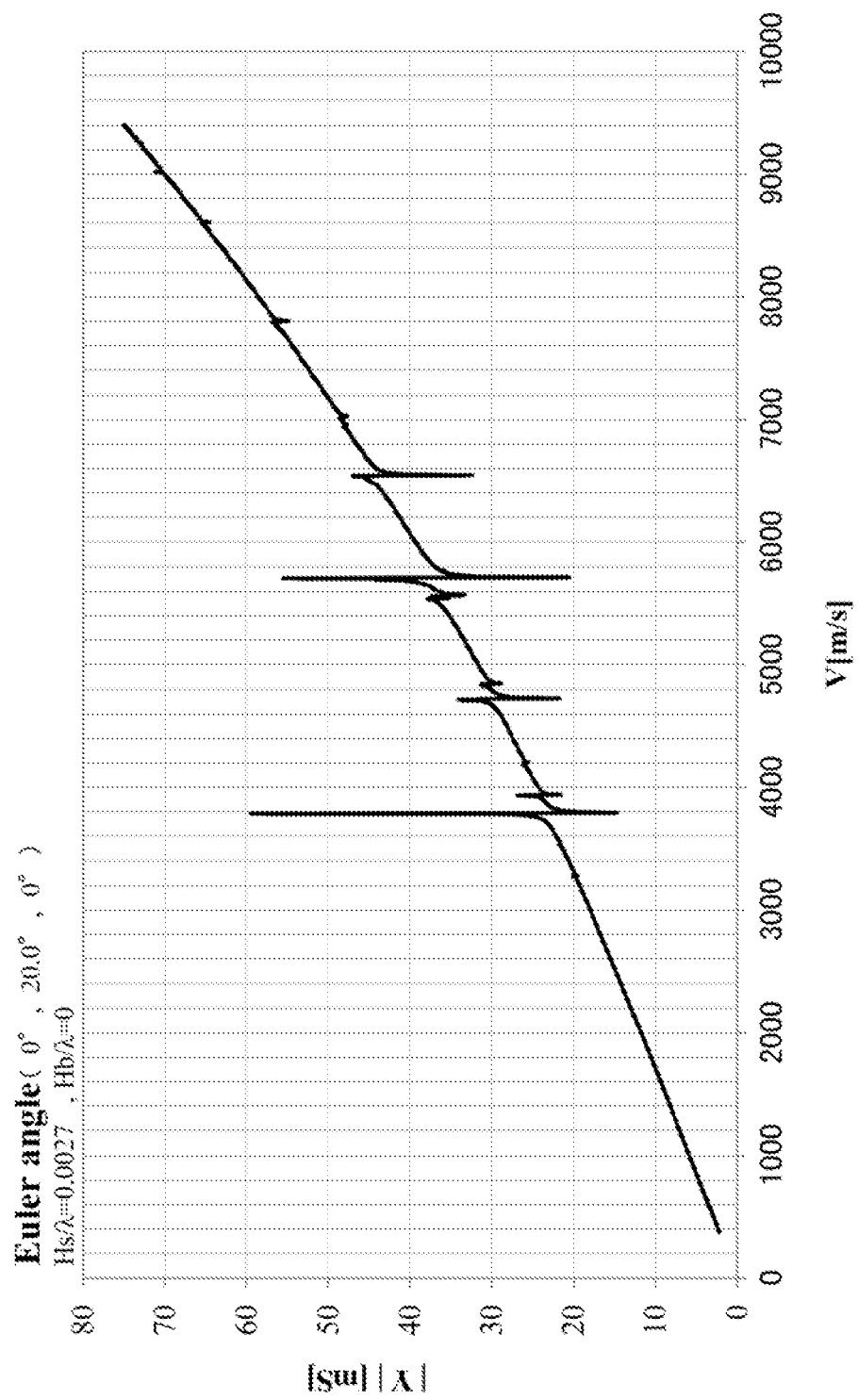
FIG. 10 is a graph showing a relationship between phase velocity V and admittance Y.

FIG. 10 shows one example of admittance Y characteristic in a case where an acoustic wave device is established with: the Euler angle (0°, 19.5°, 0°); H/$\lambda$=1.7; Hs/$\lambda$=0.00266; no back-surface electrode attached for frequency adjustment anchor purposes; and 300 pairs (600) of comb-shape excitation electrodes attached. FIG. 11 shows a comparison of the phase velocity V with theoretical values in a vibration mode in which a waveform of the acoustic wave device is observed. The comparison shows that the phase velocity V is approximately coherent, showing that a satisfactory level of analysis accuracy is obtained. Also, as clearly seen from FIGS. 10 and 11, all the unnecessary vibrations located farther in the low velocity area than the principal vibration are significantly small in excitation level. In the vicinity of phase velocity V=5700 m/s, there is a mode (vibration mode 3) which is other than the principal vibration and in which a large waveform is observed. In this vibration mode, the electromechanical coupling coefficient Ins smaller than that of the principal vibration; the equivalent series resistance R1 is higher than that of the principal vibration; and further, the frequency is higher than that of principal vibration. Therefore, this vibration mode has no influence on an oscillation at the oscillation circuit.

Figure 12:
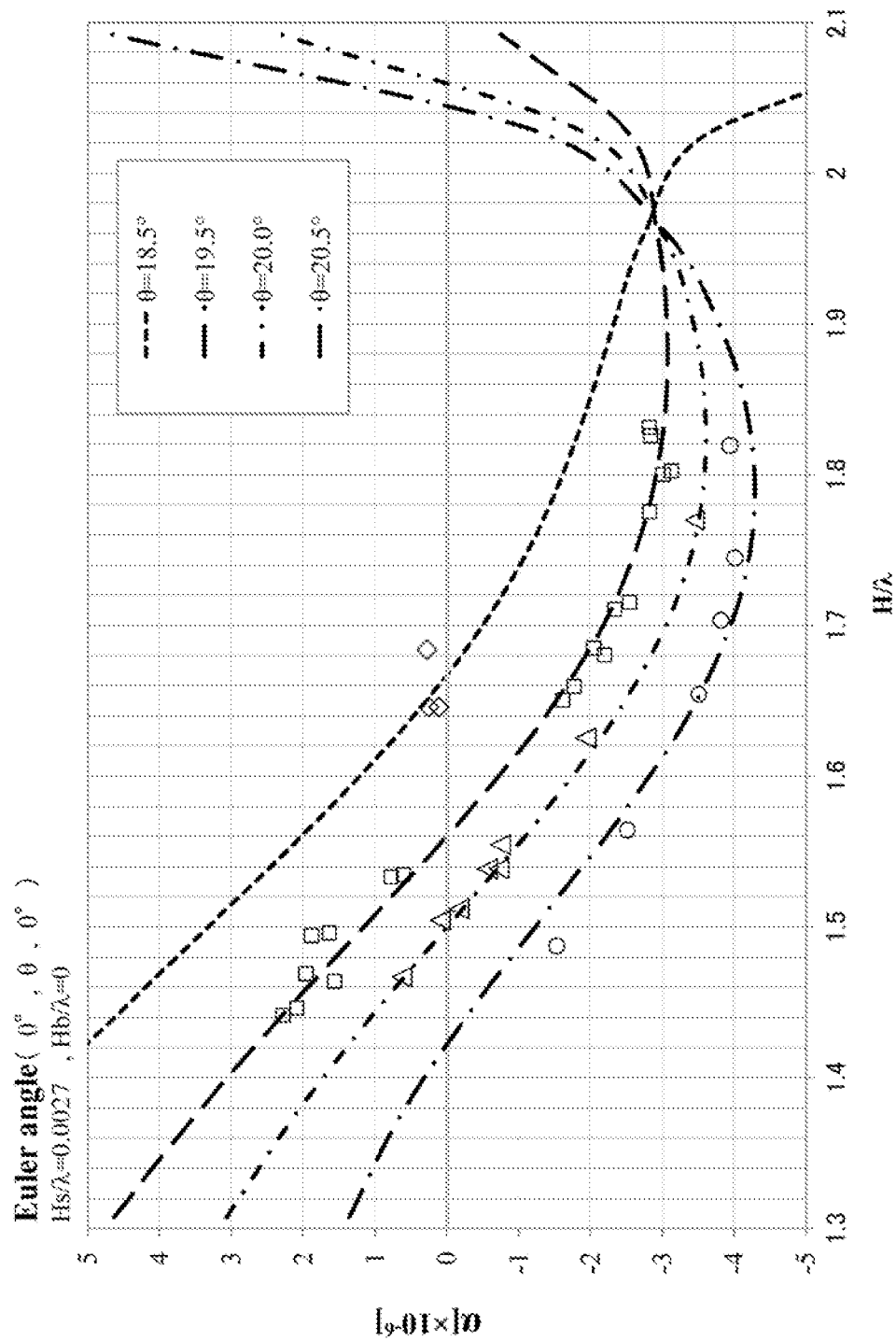
FIG. 12 is a graph of, obtained by calculation and experimentation, rotational angles θ in relation to normalized plate thickness H/λ and primary temperature coefficient α.
Figure 13:
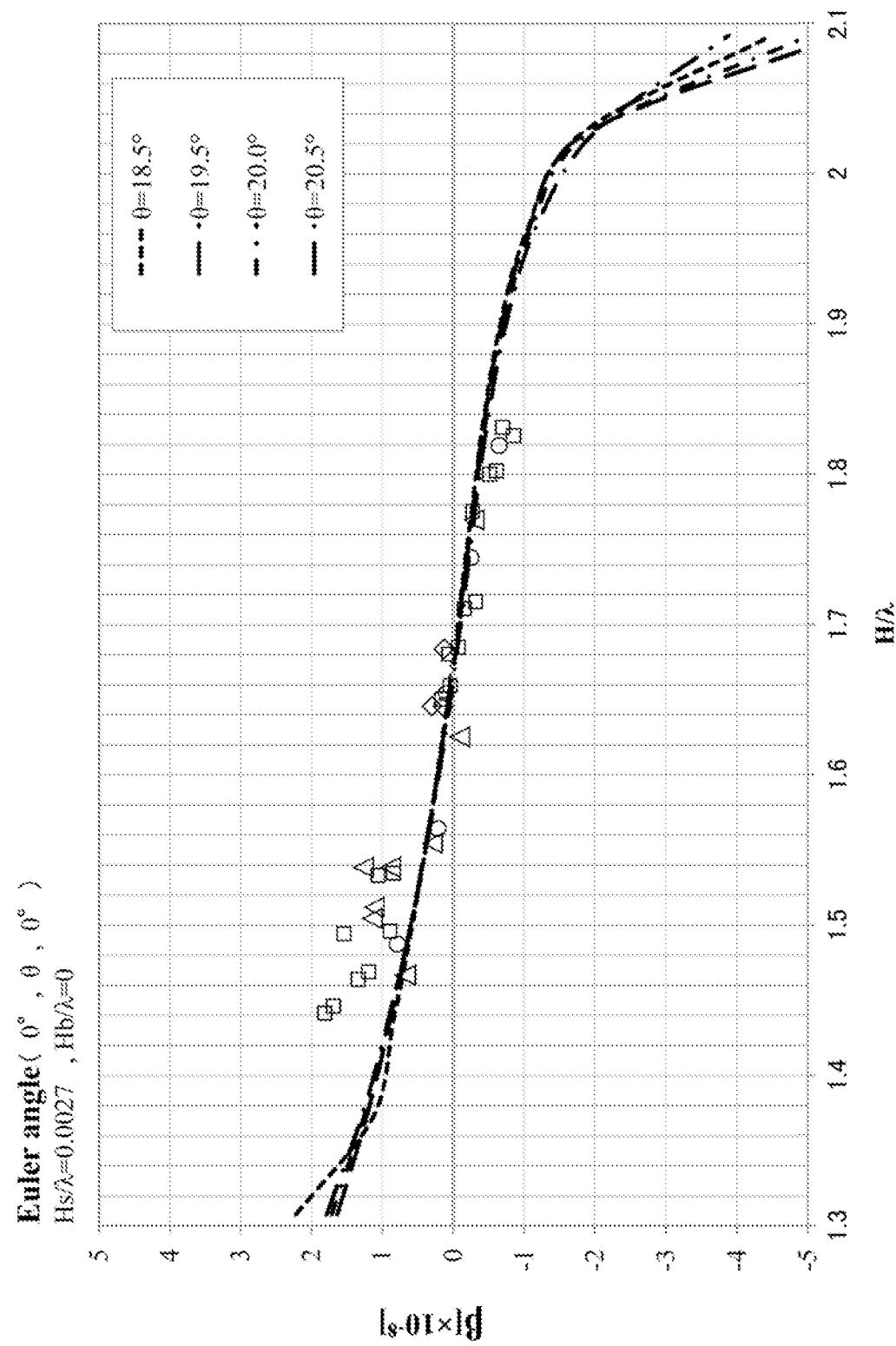
FIG. 13 is a graph of, obtained by calculation and experimentation, rotational angles θ in relation to normalized plate thickness H/λ and secondary temperature coefficient β.
Figure 14:
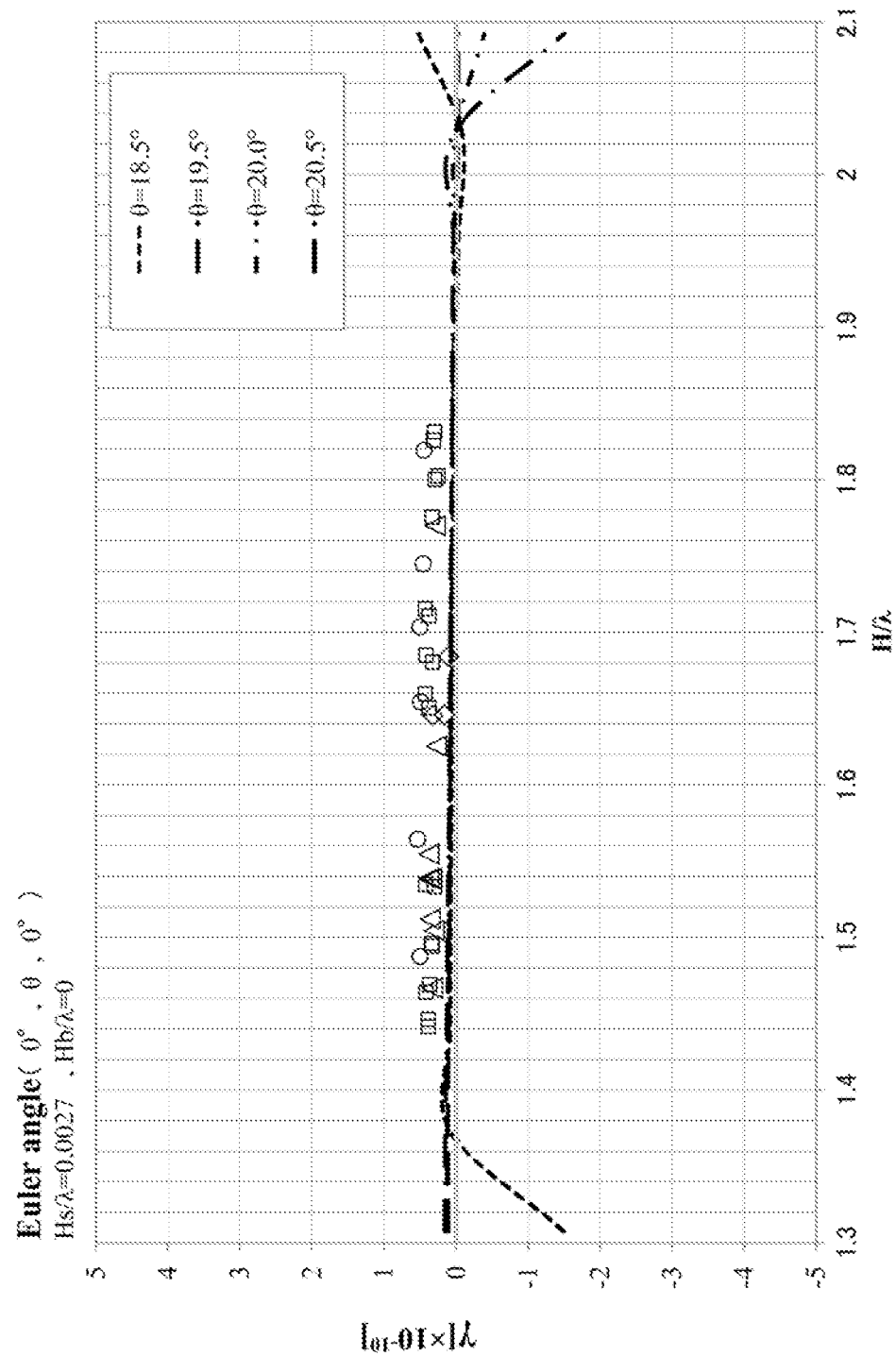
FIG. 14 is a graph of, obtained by calculation and experimentation, rotational angles θ in relation to normalized plate thickness H/λ and tertiary temperature coefficient γ.

FIGS. 12 to 14 show a comparison between theoretical values and experimental values of a relationship between α, β, and γ in a case where an acoustic wave device is established with: Au used as the electrode material; Hs/λ=0.00266; and no back-surface electrode attached. The relationship is obtained with H/λ changed under four conditions: θ=18.5, 19.5, 20.0, and 20.5. For α illustrated in FIG. 12, a value of approximately zero is observed when H/λ at four θs is about 1.5. For β illustrated in FIG. 13, the curves of θ=18.5, 19.5, 20.0, and 20.5 are approximately in an overlapped state, and a value of approximately zero is observed when H/λ is in the range of from 1.6 to 1.7. Similar trends are observed in the experimental values. For γ illustrated in FIG. 14, the curves of θ=18.5, 19.5, 20.0, and 20.5 are approximately in an overlapped state, and a value of approximately zero is observed when H/λ is in the range of 1.3 to 2.0. While the experimental values are slightly larger than the theoretical values, the difference in value is as significantly small as $0.3 \times 10^{-10}$. For each θ, β and γ change subtly, and only α can be corrected to a large degree. Thus, in order to satisfy a predetermined frequency temperature characteristic, it is possible to correct the cutting angle at H/λ where β=0, thereby making α=0. Thus, as illustrated in FIGS. 12 to 14, by making θ=18.5 and H/λ=1.67, an acoustic wave device in which a predetermined frequency temperature characteristic is satisfied is obtained. It is to be noted, however, that the above-described conditions are in the case where Au is used as the electrode material and Hs/λ=0.00266, and that based on the electrode material and/or Hs/λ, it is necessary to make an optimal combination where α=β=0. It is to be noted that while in the experimentation Cr is used as a contact metal under the Au electrode, since the thickness of Cr significantly small, Cr has no influence on the verification of the frequency temperature characteristic. As the contact metal, it is possible to use another metal such as nickel (Ni), titanium (Ti), and an alloy of the foregoing.

Figure 15:
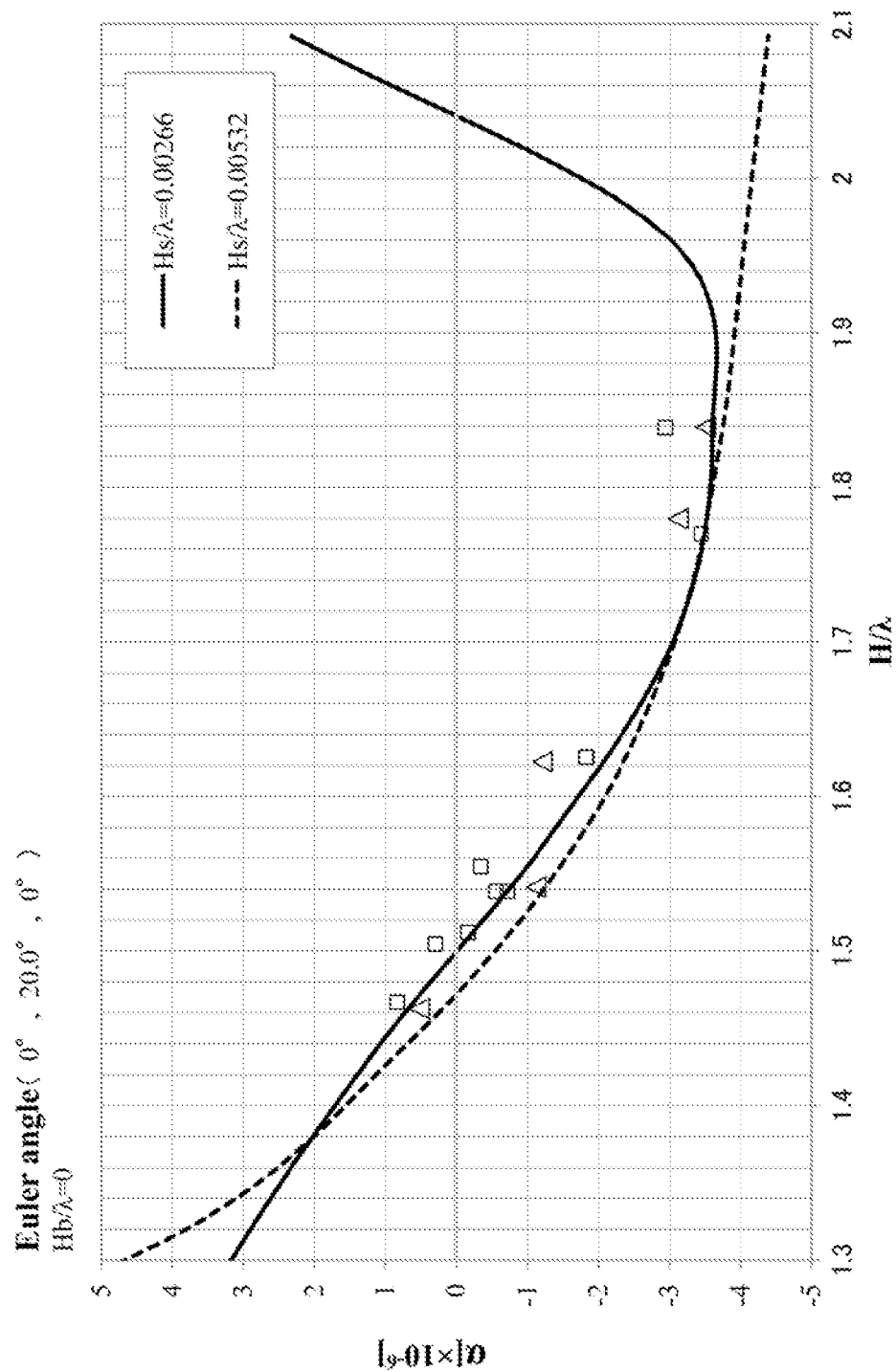
FIG. 15 is a graph showing a comparison between a theoretical value and an experimental value of each normalized excitation-electrode film thickness Hs/λ in relation to normalized plate thickness H/λ and primary temperature coefficient α.
Figure 16:
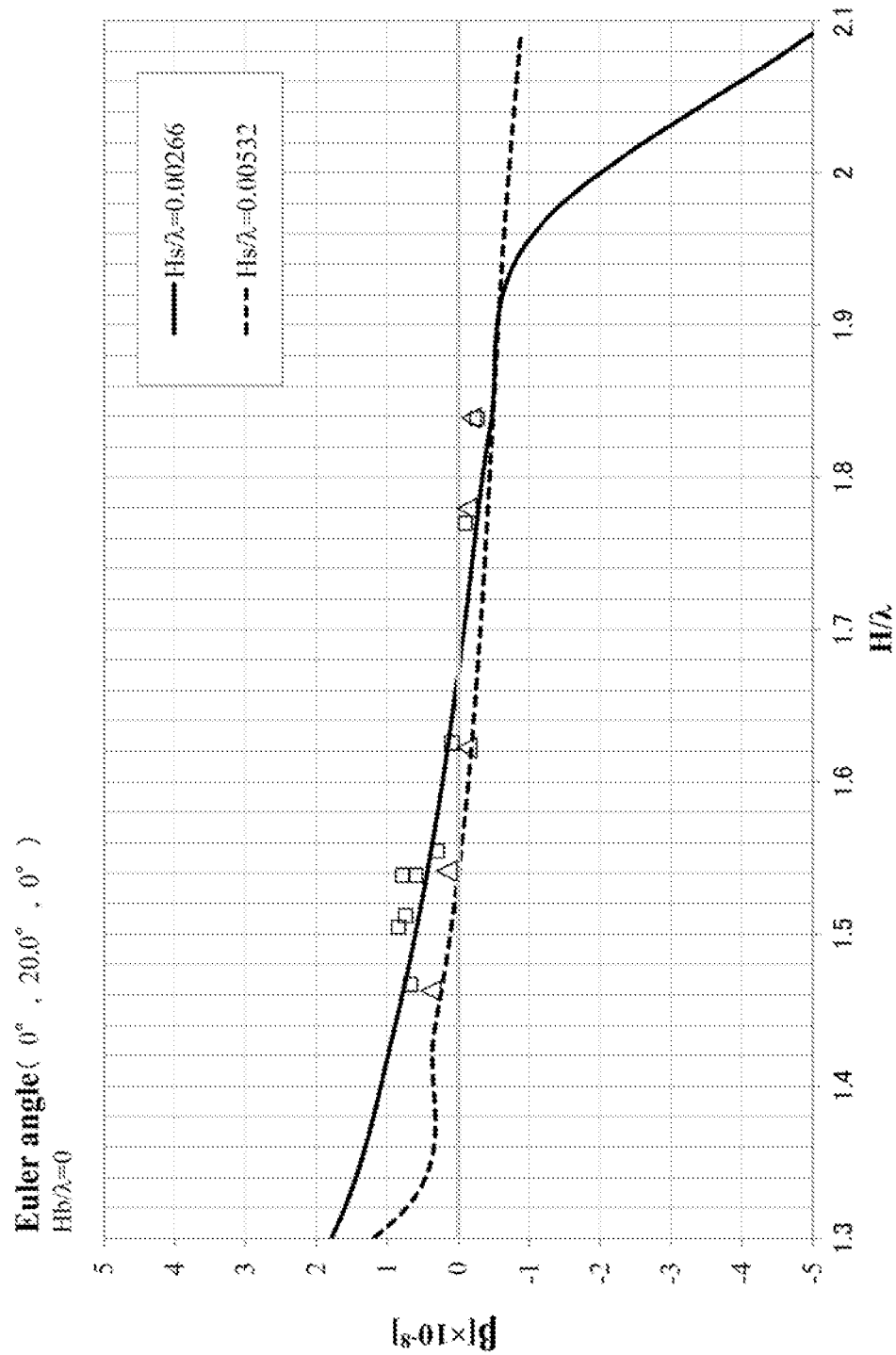
FIG. 16 is a graph showing a comparison between a theoretical value and an experimental value of each normalized excitation-electrode film thickness Hs/λ in relation to normalized plate thickness H/λ and secondary temperature coefficient β.
Figure 17:
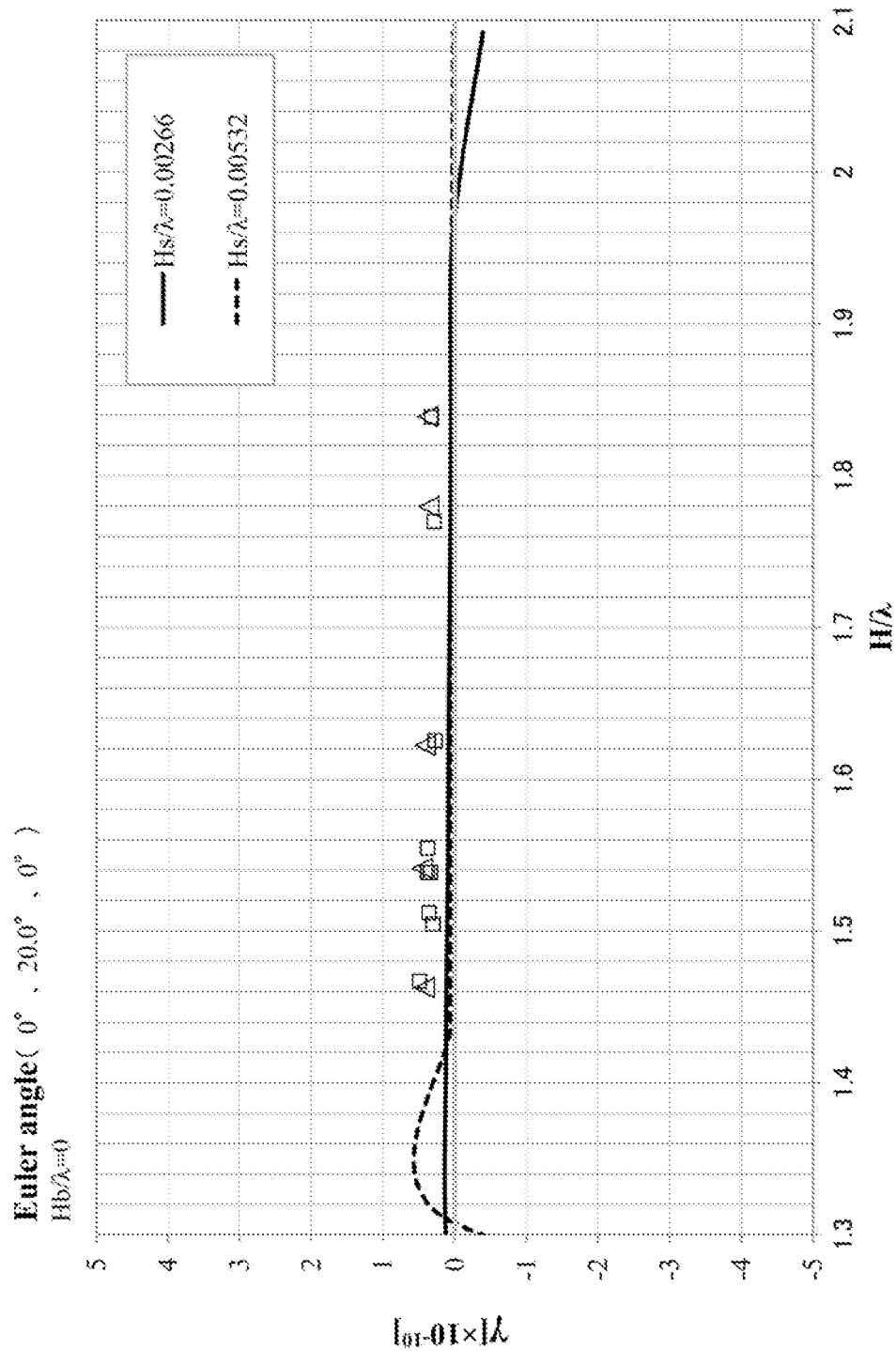
FIG. 17 is a graph showing a comparison between a theoretical value and an experimental value of each normalized excitation-electrode film thickness Hs/λ in relation to normalized plate thickness H/λ and tertiary temperature coefficient γ.

FIGS. 15 to 17 show a comparison between theoretical values and experimental values of a relationship between α, β, and γ in a case where Au is used as the electrode material and H/λ is changed with Hs/λ=0.00266, 0.00532. FIGS. 15 to 17 show that relative to Hs/λ, α and β change, while γ changes significantly subtly. Thus, as described above, with such H/λ that β=0 depending on Hs/λ, by correcting θ so that α=0, it is possible to make α=β=0 while maintaining γ at a small level, ensuring that a predetermined frequency temperature characteristic is satisfied.

Figure 18:
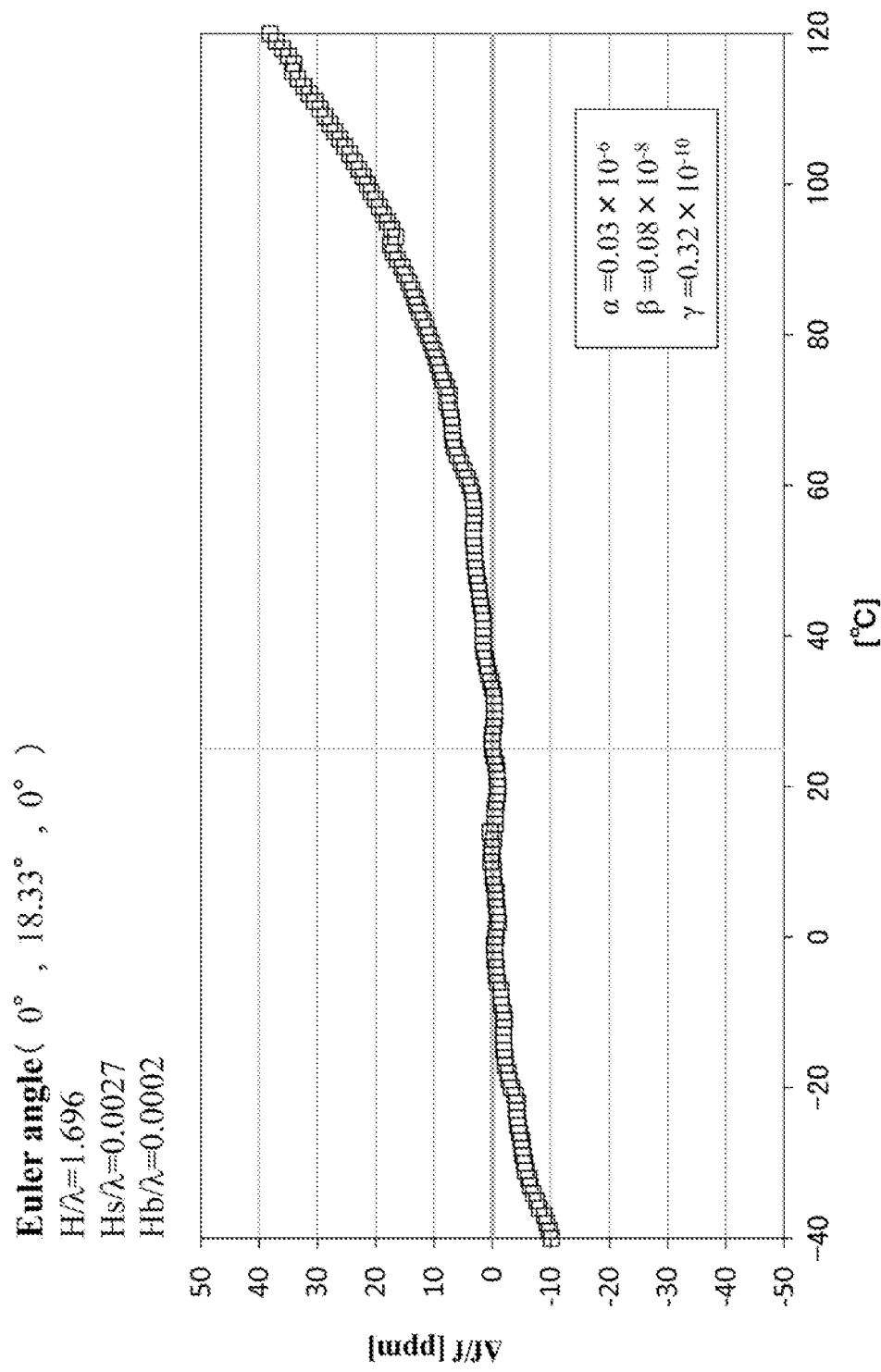
FIG. 18 is a graph showing measured data of one example of combinations in which α, β=0.

As has been described hereinbefore, it has been confirmed that the acoustic wave device disclosed in the present application is capable of making an oscillation of a high-frequency basic wave and has a frequency temperature characteristic equal or superior to the frequency temperature characteristic of an AT-cut crystal resonator. Also, all the unnecessary vibrations whose phase velocity V is lower than the phase velocity V of the principal vibration used in the disclosure in the present application have an electromechanical coupling coefficient $K^2$ as significantly small as equal to or less than 0.02. Thus, as illustrated in FIG. 10, the equivalent direct resistance R1 of the unnecessary vibrations is significantly high, and the figure of merit is kept at or below two. This eliminates or minimizes oscillation errors caused by unnecessary vibrations located farther in the low frequency area than the main vibration, which is a problem inherent in typical Lamb waves. This eliminates the need for a frequency characteristic adjustment circuit (such as an LC filter circuit) in the oscillation circuit, and makes a simple circuit sufficient, such as a typical Colpitts oscillation circuit. FIG. 18 shows an example optimal result of frequency temperature characteristic of the acoustic wave device. Production conditions are: the Euler angle (0°, 18.33°, 0°); H/λ=1.696; Hs/λ=0.0027; and Hb/λ=0.0002. The acoustic wave device produced has such a frequency temperature characteristic that $α=0.03 \times 10^{-6}$, $β=0.08 \times 10^{-8}$, and $γ=0.32 \times 10^{-10}$. While in FIG. 18 the value of Hb/λ is specified as an actual production condition, it has been confirmed that in FIG. 17 and prior drawings, the above-described various conditions of the crystal substrate where Hb/λ=0 can be applied, such as the Euler angle (φ, θ, Ψ), the phase velocity V, H/λ, and Hs/λ, in which case a frequency temperature characteristic equal to the frequency temperature characteristic where Hb/λ=0 is obtained.

Figure 19A:
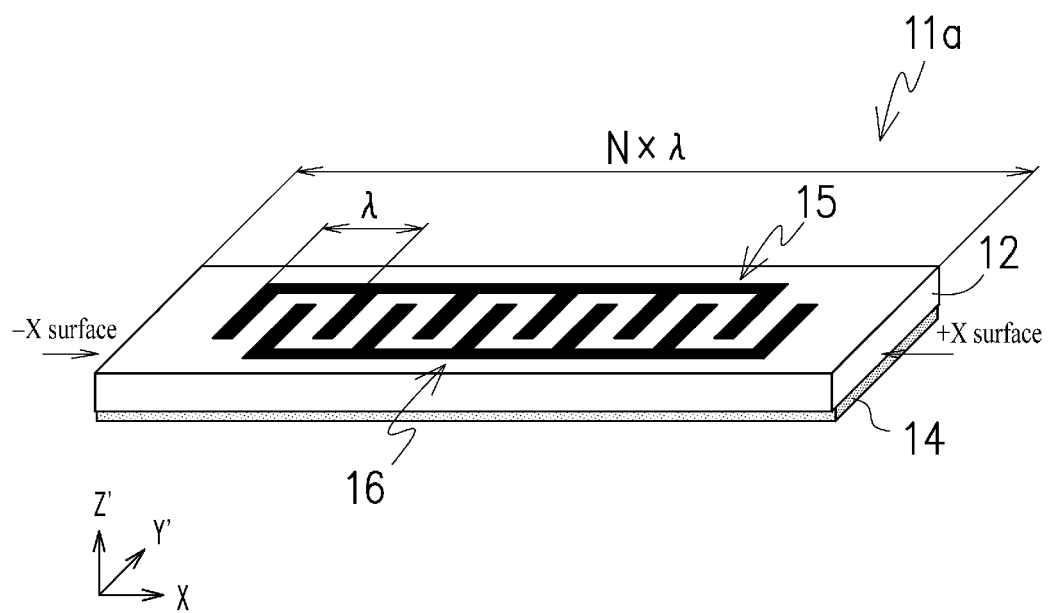
FIGS. 19A and 19B are perspective views of exteriors of acoustic wave devices according to other embodiments.
Figure 19B:
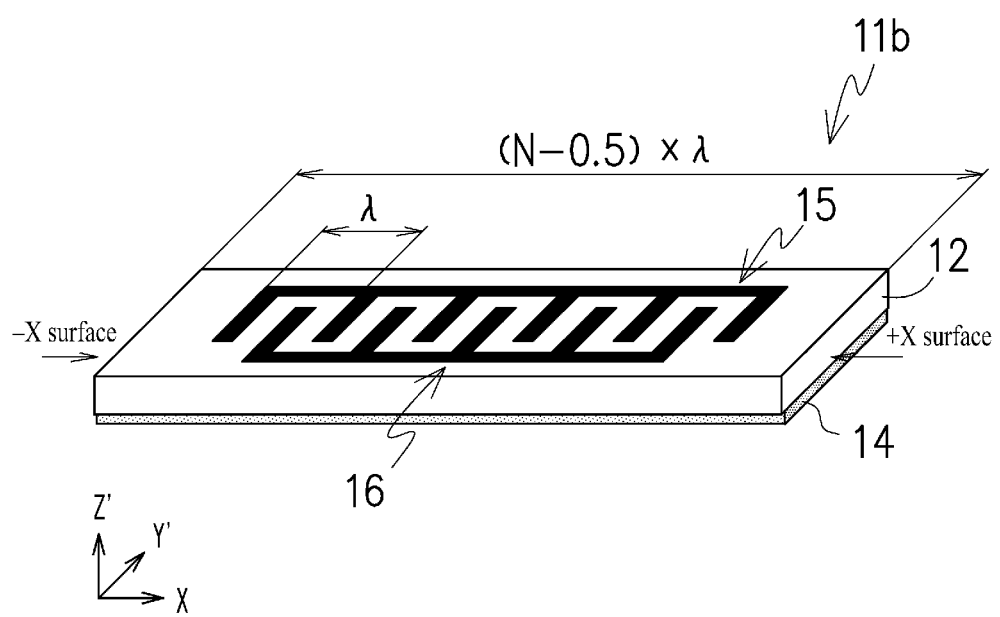

Also, while a reflector is omitted in FIG. 1, it is possible to obtain a large amount of resonance without providing a reflector by setting the dimensions of the crystal substrate 12 so that a plate wave having a wavelength of λ generates a standing wave at both end surfaces of the crystal substrate 12 in its longitudinal direction, which serve as boundaries. For example, a large amount of resonance can be obtained by: as illustrated in FIG. 19A, making such a setting that the length of the crystal substrate 12 in the X axis direction is integer N times the wavelength A; or as illustrated in FIG. 19B, decreasing the number of one-side electrode fingers facing the other-side electrode fingers and making such a setting that the length of the crystal substrate 12 in the X axis direction is (N−0.5 times) the wavelength λ. The crystal substrate 12 is close to a Z plate, and the propagation direction of a plate wave is parallel to the X axis. With this configuration, when a standing wave is generated at both end surfaces of the crystal substrate 12, which serve as boundaries, the both end surfaces become a +X surface and a −X surface of a quartz crystal. These surfaces are surfaces where the most perpendicularly stable side surfaces are formed at the time of etching punching and thus approximately perpendicular reflection surfaces are formed, ensuring that a stable standing wave is generated.

The vibration mode of the plate wave disclosed in the present application is a lowest frequency mode among the vibration modes having a figure of merit in excess of two, and the Euler angle, H/λ, and Hs/λ are set so that α, β, and γ become values of approximately zero. This ensures that a typical Colpitts oscillation circuit can be used to make a stable oscillation. Also, as described above, all the unnecessary vibrations whose phase velocity V is lower than the phase velocity V of the principal vibration used in the disclosure in the present application have an electromechanical coupling coefficient $K^2$ as significantly small as equal to or less than 0.02. This ensures that an excellent frequency characteristic, with minimized phase noise and jitter, is obtained over a wide range of temperature. Generally, an inductive state is ensured insofar as the figure of merit is two or more, and an oscillation can be made by a Colpitts oscillation circuit. If, however, the figure of merit is less than two, the reactance component becomes positive, that is, an inductive state is not ensured, and an oscillation cannot be made using a Colpitts oscillation circuit.

In the process of producing the acoustic wave device 11 disclosed in the present application, such a condition is set that the principal vibration has a figure of merit of two or more and the unnecessary vibration has a figure of merit of less than two. Under this condition, the thickness of the crystal substrate and the thickness of the back-surface electrode are determined. This effectively eliminates or minimizes oscillations caused by unnecessary vibrations, ensuring that more stable oscillation characteristics are obtained.

Also, the plate wave is in a vibration mode in which a lateral wave and a longitudinal wave are combined, and there occurs a plurality of vibration-modes, as illustrated in FIG. 3, each corresponding to a different degree of combination of the lateral wave and the longitudinal wave. In these vibration modes using plate waves, as opposed to conventional Rayleigh waves, there may be other vibration modes than the necessary principal vibration mode. Specifically, there may be vibration modes that are different in phase velocity and that have a high electromechanical coupling coefficient $K^2$ (unnecessary vibrations). When an acoustic wave device is established so that the reflection coefficients of the principal vibration and an unnecessary vibration have the same sign, the equivalent series resistance R1 of the unnecessary vibration may in some cases be lower than the equivalent series resistance R1 of the principal vibration mode. This has caused an abnormal oscillation at the time when an oscillation is made at an oscillation circuit.

However, as illustrated in FIG. 11, the vibration mode (S3) of the plate wave selected in the acoustic wave device disclosed in the present application has the highest electromechanical coupling coefficient $K^2$ among the plurality of vibration modes, and has the relationship $K^2 > K^2$ (X) with the electromechanical coupling coefficient $K^2$ (X) of a vibration mode in which the phase velocity V is lower than the selected vibration mode. This eliminates or minimizes an abnormal oscillation at the time when an oscillation is made at an oscillation circuit.

REFERENCE SIGNS LIST

α Primary temperature coefficient
β Secondary temperature coefficient
γ Tertiary temperature coefficient
λ Wavelength
V Phase velocity
Y Admittance
H/λ Normalized plate thickness
Hs/λ Normalized excitation-electrode film thickness
Hb/λ Normalized back-surface electrode film thickness
11 Acoustic wave device
12 Crystal substrate
13 Excitation electrode
14 Back-surface electrode
15, 16 Comb-shape excitation electrode
15a, 16a Base electrode
15b, 16b Electrode finger

What is claimed is:
1. An acoustic wave device comprising:
a crystal substrate cut from a quartz crystal boule having three-dimensional crystal orientations defined by an X axis, a Y axis, and a Z axis, the quartz crystal boule being cut on the Y axis and the Z axis while being rotated about the X axis, the quartz crystal boule being cut by a rotational angle specified by a right-handed Euler angle (ϕ, θ, Ψ); and
at least one comb-shape excitation electrode configured to excite the crystal substrate to make plate waves,
wherein the crystal substrate is made by cutting the quartz crystal boule such that the rotational angle is within ranges of ϕ=0±2°, θ=17.5° to 19.5°, and Ψ±2°,
wherein a plate wave, among the plate waves, having a phase velocity in a range of from 3500 to 4000 m/s, is selected as a vibration mode of the crystal substrate, and
wherein when H represents a substrate-thickness of the crystal substrate and λ represents a wavelength of the plate waves, a normalized substrate-thickness H/λ is in a range of 1.5<H/λ<2.0.

2. The acoustic wave device according to claim 1, further comprising:
at least one comb-shape excitation electrode configured to excite plate waves on a front surface of the crystal substrate; and
a back-surface electrode provided on a back surface of the crystal substrate and configured to adjust frequency.

3. The acoustic wave device according to claim 2,
wherein when the comb-shape excitation electrode has a film thickness of Hs and the plate waves have the wavelength λ, a normalized film thickness Hs/λ of the comb-shape excitation electrode is in a range of 0.0013<Hs/λ<0.0065.

4. The acoustic wave device according to claim 1,
wherein the vibration mode of the selected plate wave has a lowest frequency among a plurality of vibration modes of plate waves each having a figure of merit in excess of two.

5. The acoustic wave device according to claim 1,
wherein the vibration mode of the selected plate wave has a highest electromechanical coupling coefficient among a plurality of vibration modes each having a phase velocity in a range of from 3500 to 4000 m/s, and the electromechanical coupling coefficient is higher than an electromechanical coupling coefficient of a vibration mode of a plate wave having a phase velocity lower than the phase velocity of the selected vibration mode of the selected plate wave.

6. The acoustic wave device according to claim 2, wherein the comb-shape excitation electrode comprises a metal film comprising Au or Al as a main component.

* * * * *